(12) United States Patent
Nobbe

(10) Patent No.: US 10,177,895 B2
(45) Date of Patent: *Jan. 8, 2019

(54) SYSTEMS AND METHODS FOR MINIMIZING INSERTION LOSS IN A MULTI-MODE COMMUNICATIONS SYSTEM

(71) Applicant: pSemi Corporation, San Diego, CA (US)

(72) Inventor: Dan William Nobbe, Crystal Lake, IL (US)

(73) Assignee: pSemi Corporation, San Diego, CA (US)

(*) Notice: Subject to any disclaimer, the term of this patent is extended or adjusted under 35 U.S.C. 154(b) by 95 days.

This patent is subject to a terminal disclaimer.

(21) Appl. No.: 15/376,498

(22) Filed: Dec. 12, 2016

(65) Prior Publication Data

US 2017/0163402 A1 Jun. 8, 2017

Related U.S. Application Data

(63) Continuation of application No. 14/742,567, filed on Jun. 17, 2015, now Pat. No. 9,559,830, which is a
(Continued)

(51) Int. Cl.
*H04J 3/00* (2006.01)
*H04L 5/14* (2006.01)
(Continued)

(52) U.S. Cl.
CPC ............ *H04L 5/14* (2013.01); *H03H 7/0161* (2013.01); *H03H 7/465* (2013.01); *H04B 1/406* (2013.01);
(Continued)

(58) Field of Classification Search
CPC .......... H03H 2007/013; H03H 7/0115; H03H 7/0161; H04B 1/406; H04L 5/14
See application file for complete search history.

(56) References Cited

U.S. PATENT DOCUMENTS 9,559,830 B2 * 1/2017 Nobbe ................ H03H 7/0161
2003/0022631 A1 * 1/2003 Rhodes .................... H04B 1/48
455/78

(Continued)

OTHER PUBLICATIONS

Nguyen, Minh Trang T., Office Action received from the USPTO dated Mar. 10, 2016 for U.S. Appl. No. 14/742,567, 12 pgs.

(Continued)

*Primary Examiner* — Minh Trang T Nguyen
(74) *Attorney, Agent, or Firm* — Jaquez Land Greenhaus LLP; Martin J. Jaquez, Esq.; Alessandro Steinfl, Esq.

(57) ABSTRACT

Methods and system for using a multifunctional filter to minimize insertion loss in a multi-mode communications system are described. Specifically described is a multifunctional filter that is configurable to operate in a band-pass mode when a first type of signal is propagated through the multifunctional filter, and to operate in a low-pass mode when a second type of signal is propagated through the multifunctional filter. The multifunctional filter presents a lower insertion loss to the second type of signal when operating in the low-pass mode than in the band-pass mode.

17 Claims, 3 Drawing Sheets

Related U.S. Application Data continuation of application No. 13/228,751, filed on Sep. 9, 2011, now Pat. No. 9,065,540.

(51) Int. Cl.
  *H03H 7/01* (2006.01)
  *H04B 1/403* (2015.01)
  *H03H 7/46* (2006.01)

(52) U.S. Cl.
  CPC ..... *H03H 7/0115* (2013.01); *H03H 2007/013* (2013.01); *H03H 2210/036* (2013.01)

(56) References Cited

U.S. PATENT DOCUMENTS

| | | |
|---|---|---|
| 2004/0246074 A1 | 12/2004 | Humphrey |
| 2006/0194550 A1 | 8/2006 | Block et al. |
| 2016/0020892 A1 | 1/2016 | Nobbe |

OTHER PUBLICATIONS

Nguyen, Minh Trang T., Notice of Allowance received from the USPTO dated Nov. 14, 2016 for U.S. Appl. No. 14/742,567, 5 pgs.
Nobbe, Dan, Response filed in the USPTO dated May 13, 2016 for U.S. Appl. No. 14/742,567, 10 pgs.

* cited by examiner

SYSTEMS AND METHODS FOR MINIMIZING INSERTION LOSS IN A MULTI-MODE COMMUNICATIONS SYSTEM

CROSS REFERENCE TO RELATED APPLICATION-CLAIM OF PRIORITY

The present application is a continuation of commonly owned co-pending U.S. patent application Ser. No. 14/742,567 filed on Jun. 17, 2015. Application Ser. No. 14/742,567 is a continuation of commonly owned issued U.S. patent application Ser. No. 13/228,751 filed on Sep. 9, 2011, issued on Jun. 23, 2015 as U.S. Pat. No. 9,065,540; said application Ser. Nos. 14/742,567, 13/228,751 and U.S. Pat. No. 9,065,540 are hereby incorporated by reference herein in their entirety.

1. Field

The present teachings relate to communications systems. In particular, the present teachings relate to using a multifunctional filter for minimizing insertion loss in a multi-mode communications system.

2. Description of Related Art

Multi-band, multi-mode cellular phones are quite popular because of the convenience and flexibility provided by such devices, especially when a user of such a cellular phone travels between areas that are serviced by service providers using different signal propagation modes. Two of these signal propagation modes are referred to in the art as a time division duplex (TDD) mode and a frequency division duplex (FDD) mode.

A cellular phone that is configured to selectably operate in either the TDD mode or the FDD mode, typically incorporates a first set of circuit elements that is optimized for TDD mode of operation and a second set of circuit elements that is optimized for FDD mode of operation. A switching mechanism is employed to cut out one set of circuit elements and insert the other set of signal elements in a signal propagation path when it is desired to change the cellular phone from one mode of operation to the other.

FIG. 1 shows a prior art communications system 100 that incorporates two sets of circuit elements as mentioned above. The first set of circuit elements is contained in TDD system 120 that is optimized for TDD mode of operation while the second set of circuit elements is contained in FDD system 105 that is optimized for FDD mode of operation. A mode selector switch 130 is used for changing communications system 100 from one mode of operation to the other.

Signal line 131 couples mode selector switch 130 to an antenna (not shown) and carries communications signals in either FDD or TDD modes to/from the antenna. Specifically, a FDD signal is carried on signal line 131 when mode selector switch 130 is configured to couple FDD system 105 to signal line 131. FDD system 105 includes a band-pass filter 115 that may be a standalone element or may be a part of a duplexer 110 (shown as a dashed box). Duplexer 110 permits duplex mode of operation wherein a transmit side signal can be coupled from transmit amplifier 107 into mode selector switch 130 while a receive side signal can be coupled from mode selector switch 130 into receiver 106.

A TDD signal is carried on signal line 131 when mode selector switch 130 is configured to couple TDD system 120 to signal line 131. TDD system 120 includes a low-pass filter 125, a transmit amplifier 116, and a receiver 117. In carrying out a comparison between signal losses in the TDD mode of operation and the FDD mode of operation, it will be relevant to point out that the insertion loss imposed by low-pass filter 125 is lower than that imposed by band pass filter 115.

Typically, the insertion loss of low-pass filter 125 is of the order of 0.5 dB whereas the insertion loss of band pass filter 115 is of the order of 2.5 dB. As can be understood, insertion loss plays a significant role in signal transmission. Consequently, the prior art configuration depicted in FIG. 1 provides for two separate circuits so as to minimize insertion loss when system 100 is operating in the TDD mode.

However, as can be understood, such a configuration can lead to various undesirable issues such as higher component count, higher production cost, bulkier packaging, and increased power consumption.

SUMMARY

According to a first aspect of the present disclosure, a method of minimizing insertion loss in at least one of two types of signals propagated through a communications system is provided. The method includes configuring a multifunctional filter to operate in a band-pass mode when a first type of signal is propagated through the multifunctional filter, and reconfiguring the multifunctional filter to operate in a low-pass mode when a second type of signal is propagated through the multifunctional filter, the low-pass mode providing a lower insertion loss upon the second type of signal than the band-pass mode.

According to a second aspect of the disclosure, a method of minimizing insertion loss in a duplexer is provided. The method includes configuring the duplexer to operate in a band-pass mode when a first type of signal is propagated through the duplexer, and reconfiguring the duplexer to operate in a low-pass mode when a second type of signal is propagated through the duplexer, the low-pass mode providing a lower insertion loss upon the second type of signal than the band-pass mode.

According to a third aspect of the disclosure, a communications system is provided. The system includes a multifunctional filter that is configurable to operate in a band-pass mode when a first type of signal is propagated through the multifunctional filter, and to operate in a low-pass mode when a second type of signal is propagated through the multifunctional filter, the low-pass mode providing a lower insertion loss to the second type of signal than the band-pass mode.

Further aspects of the disclosure are shown in the specification, drawings and claims of the present application.

BRIEF DESCRIPTION OF THE DRAWINGS

Many aspects of the present disclosure can be better understood with reference to the following drawings. The components in the drawings are not necessarily drawn to scale. Instead, emphasis is placed upon clearly illustrating various principles. Moreover, in the drawings, like reference numerals designate corresponding parts throughout the several views.

DETAILED DESCRIPTION

Throughout this description, embodiments and variations are described for the purpose of illustrating uses and implementations of the inventive concept. The illustrative description should be understood as presenting examples of the inventive concept, rather than as limiting the scope of the concept as disclosed herein. For example, it will be understood that terminology such as multi-functional, multi-mode, nodes, terminals, voltage drops, circuits, blocks, connections, lines, and coupling are used herein as a matter of convenience for description purposes and should not be interpreted literally in a narrow sense. Furthermore, the words "block" or "functional blocks" as used herein refer not only to a circuit containing discrete components or integrated circuits (ICs), but may also refer to various other elements such as a module, a sub-module, or a mechanical assembly. Similarly, the word "line" as used herein may refer to various connectivity elements such as a wire, a cable, a copper track on a printed circuit board, an optical fiber, or a wireless link. Also, it must be understood that the word "example" as used herein (in whatever context) is intended to be non-exclusionary and non-limiting in nature. It will be further understood that labels such as "band-pass" and "notch" filter are used herein solely for purposes of description. Consequently, other labels and other filtering functionalities are included in the scope of the concept disclosed herein. A person of ordinary skill in the art will understand the principles described herein and recognize that these principles can be applied to a wide variety of applications using a wide variety of physical elements.

In particular, described herein are some systems and methods pertaining to using a multifunctional filter for minimizing insertion loss in a multi-mode communications system. As can be understood by one of ordinary skill in the art, the described systems and methods can be incorporated into a wide variety of communications systems, and furthermore such communications systems may be used in a variety of devices and applications spanning a variety of operating conditions (frequencies, voltages, power etc).

Figure 1:
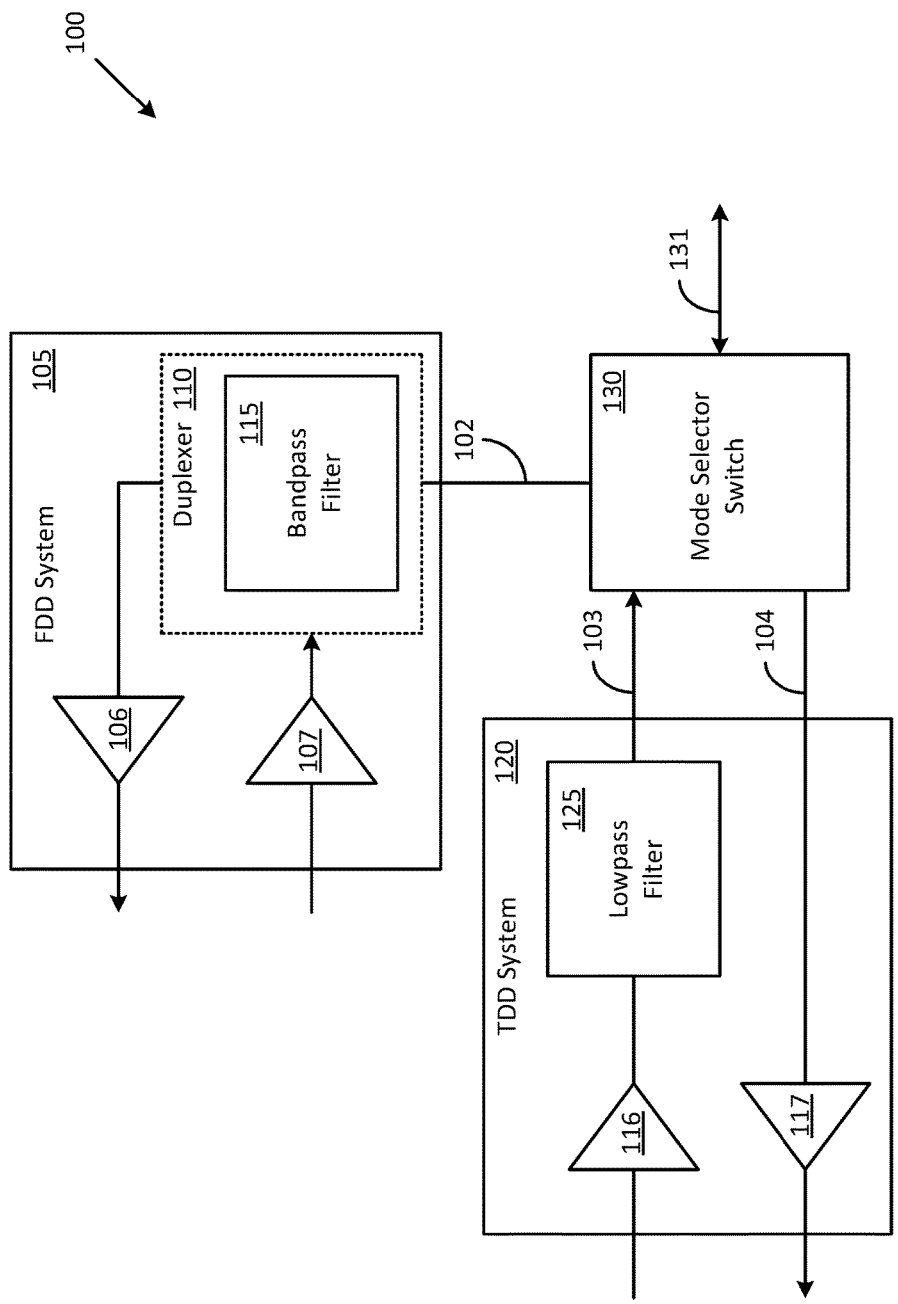
FIG. 1 shows a prior art communications system that uses two separate sets of circuit elements for selectably operating the communications system in either a TDD mode or a FDD mode.
Figure 2:
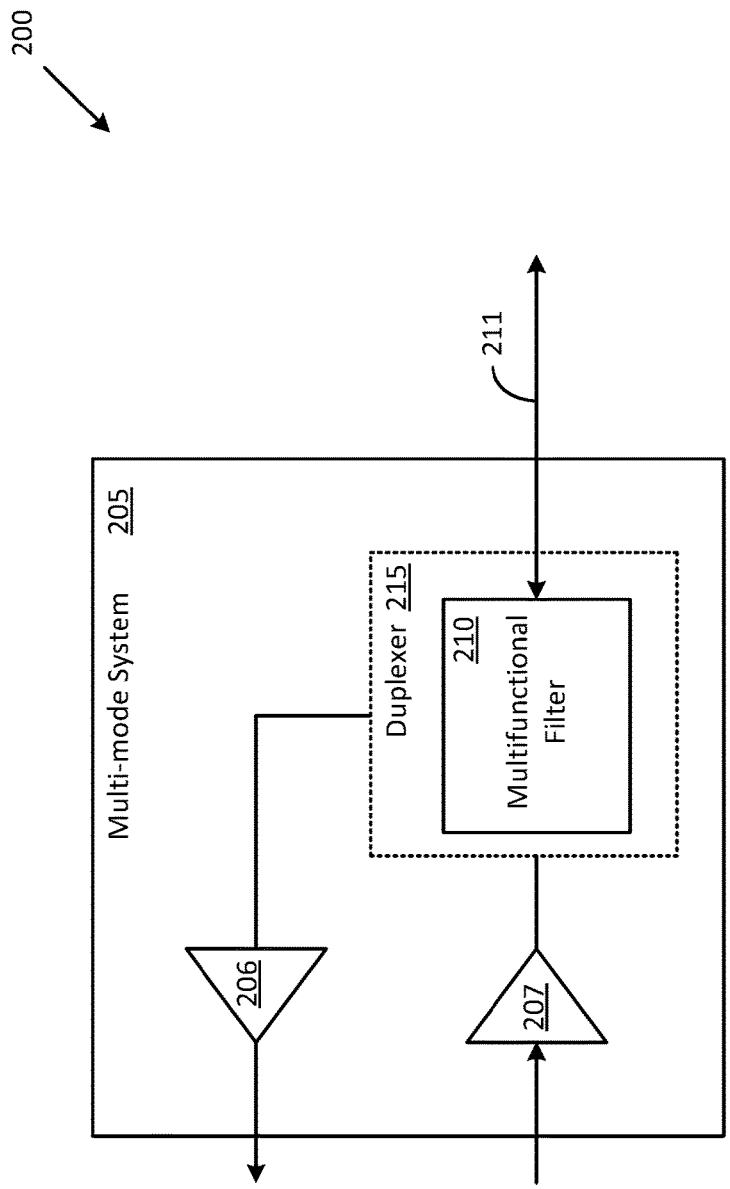
FIG. 2 shows a communications system incorporating a multifunctional filter that can be selectively configured for operating the communications system in either a TDD mode or a FDD mode.

FIG. 2 shows a communications system 200 having a multi-mode system 205 incorporating a multifunctional filter 210 that can be selectively configured for operating communications system 200 in either a TDD mode or a FDD mode. It will be understood that multifunctional filter 210 may be referred to alternatively as a dual-purpose filter, an integrated filter, or a combination filter. Persons of ordinary skill in the art can recognize the equivalency amongst such alternative labels.

It will also be understood that communications system 200 includes several other elements (in addition to multi-mode system 205), which are not shown in FIG. 2. These other elements have been omitted so as to avoid obscuring the primary focus of this disclosure.

Multi-mode system 205 further includes a wide band transmit amplifier 207 and a wide band receiver 117, each of which is selected to have a bandwidth, as well as other characteristics that accommodate both FDD and TDD modes of signal propagation. In a first embodiment, multi-functional filter 210 is a standalone component that may be placed in either a transmit signal propagation path or a receive signal propagation path. In another embodiment, multifunctional filter 210 is a part of a duplexer 215 that is shown as a dashed box in FIG. 2. Duplexer 215 couples any signal that is received on line 211 from an antenna (not shown) and routes this received signal to wide band receiver 117. Duplexer 215 further couples transmit-side signals from wide band transmit amplifier 207 into line 211 through which the transmit-side signals are coupled to the antenna. As can be understood, transmit-side signals are generally much stronger in signal amplitude than the received-side signals. Duplexer 215 prevents a large part, or all of, this stronger transmit-side signal from reaching wide band receiver 206 and causing damage to receiver 206, which is designed to receive low amplitude signals and therefore, contains circuitry susceptible to overload damage.

As mentioned above, multifunctional filter 210 can be selectively configured in accordance with communications system 200 operating in either a TDD mode or a FDD mode. Specifically, multifunctional filter 210 is configurable as a band-pass filter when communications system 200 is placed in an FDD mode of operation. Conversely, multifunctional filter 210 is configurable as a low-pass filter when communications system 200 is placed in a TDD mode of operation. The low-pass filter configuration imposes a lower insertion loss upon a TDD signal than that imposed by the band-pass filter (if such a band-pass filter were permitted to be located in a signal propagation path of the TDD signal).

In various other embodiments, multifunctional filter 210 can be selectively configured in accordance with multi-mode system 205 operating in modes other than a TDD mode or a FDD mode. For example, in a first of other such operational modes, multifunctional filter 210 may be configurable to perform a first filtering function (such as, for example, low pass, high pass, band-pass, single notch, multiple notches, single band-stop, multi-band stop etc) and then re-configurable in a second operational mode to perform a second different filtering function. It can be understood that the first filtering function may be more suitable for the first operational mode but may not be optimal for the second operational mode (for example, as a result of having a higher insertion loss, or some other such undesirable characteristic).

Figure 3:
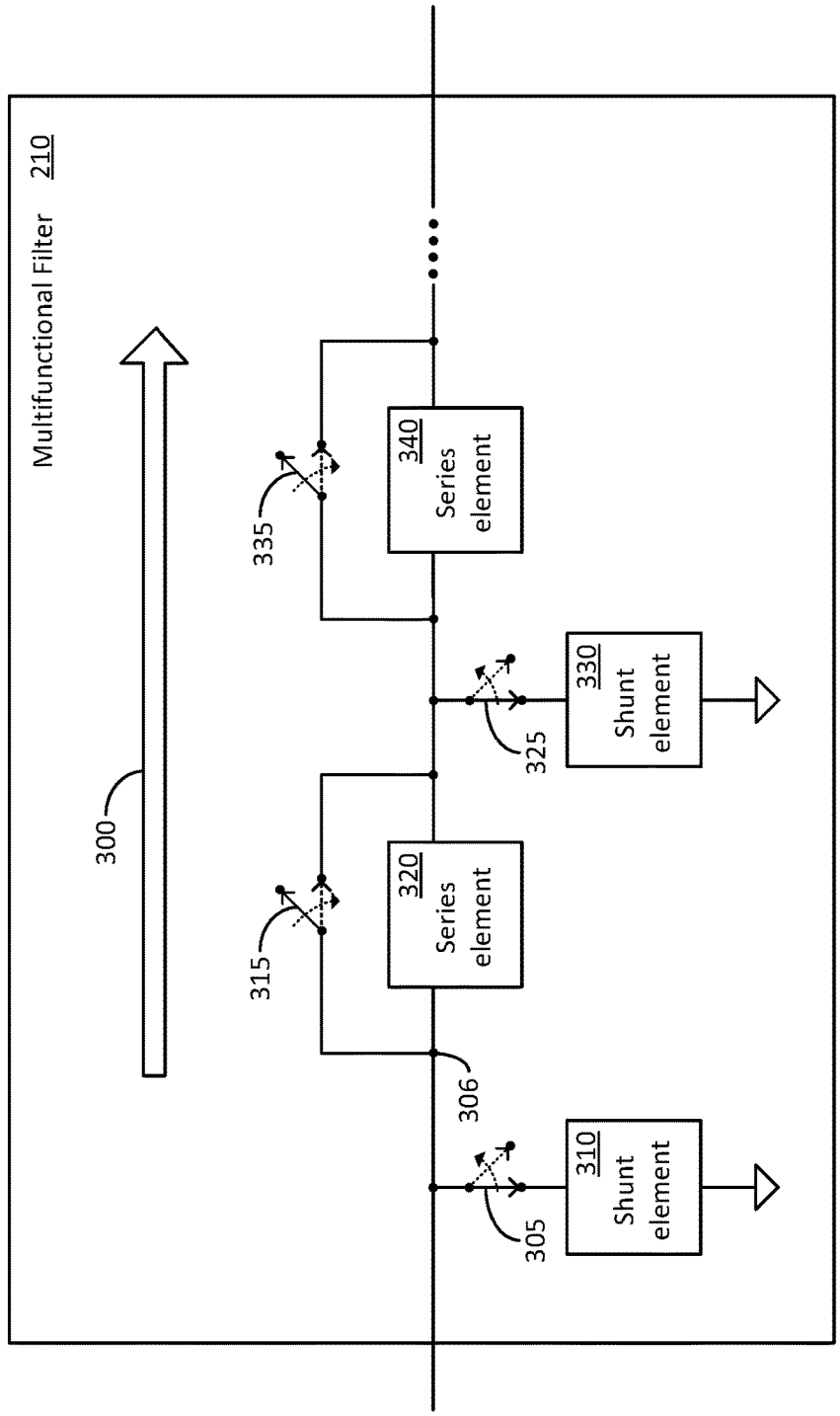
FIG. 3 shows a few components that may be contained in the multifunctional filter shown in FIG. 2.

Attention is now drawn to FIG. 3, which shows certain elements contained inside multifunctional filter 210. The configuration shown is a generic ladder network solely for purpose of description, and it will be understood that various combinations and arrangements of series and shunt elements (capacitors, inductors, resistors etc in π and/or T-configurations) may be used in various alternative embodiments. Furthermore, it will be noticed that only two filter stages are shown in FIG. 3, with each stage having one shunt element and one series element. However, a single stage or more than two stages ('n' stages) may be employed in various other embodiments, furthermore with more than one element located in each shunt and/or series limb if so desired.

Switch 305, which may be a normally-closed switch, is controllable via a control signal (not shown) that may be used to place switch 305 in an open position when it is desired to isolate shunt element 310 from signal propagation path 300. Switch 315, which may be a normally-open switch, is also provided a control signal (not shown) that may be used to place switch 315 in a closed position, thereby providing a low impedance shunt signal path that effectively eliminates series element 320 from signal propagation path 300, when so desired. Switches 325 and 335 may be operated in a similar manner for configuring shunt element 330 and series element 340 respectively.

In one implementation, each of shunt elements 310 and 330 is a capacitor (C), while each of series elements 320 and 340 is an inductor (L). When all of these elements (having appropriately selected values) are included in signal propagation path 300, multifunctional filter 210 operates as a band-pass filter. On the other hand, when some of these elements, for example, shunt element 310 and series element 340 are switched out of signal propagation path 300, multifunctional filter 210 operates as an L-C low-pass filter.

Thus, by suitably operating one or more of switches 305, 315, 325 and 335, multifunctional filter 210 can be configured as a single stage or a multi-stage filter having either a band-pass or a low-pass characteristic. The overall impedance characteristics of multifunctional filter 210 can be configured to any suitable value by not only operating one or more of switches 305, 315, 325 and 335 so as to insert or remove one or more filter stages, but also by inserting resistors in lieu of, or to complement, one or more of shunt element 310, shunt element 330, series element 320 and series elements 340.

When configured as a band-pass filter, multifunctional filter 210 may be used to selectively attenuate certain frequencies, such as undesirable harmonics or transmit-side frequencies that may cause damage to receiver 206 (FIG. 2).

Each of switches 305, 315, 325 and 335 may be implemented in several alternative ways. A non-exhaustive list of devices that may be used include relays, solid-state switches, discrete switching semiconductors (such as field effect transistors), micro-electro mechanical systems (MEMS), and controllable variable impedance devices. A few examples of controllable variable impedance devices include a varicap, a varactor, a varistor, a thyristor, and a barium strontium titanate (BST) capacitor.

Such devices may be configured to not only operate as switches (with a high impedance constituting an open switch condition and a low impedance constituting a closed switch condition), but may also, in some embodiments, be used as impedance modification devices. For example, when switch 315 is a variable inductor, the value of the inductance provided by switch 315 may be varied under suitable voltage control to provide a desired inductance value that operates in parallel with the inductance value provided by series element 320. In another example, when switch 315 is a variable capacitor, the value of the capacitance provided by switch 315 may be varied under suitable voltage control so as to provide a desired capacitance value that operates in parallel with the inductance value provided by series element 320. Such a combination may be used as part of a tuned circuit for selectively propagating certain frequencies while blocking certain other frequencies in the signal propagation path 300. In yet another example, switch 315 is provided in the form of multiple elements, for example, a resistor in parallel (or in series) with an inductor or a capacitor. Such combinations may be used for example to obtain specific Q values in a tuned circuit formed in conjunction with series element 320.

The other switches shown in FIG. 3 may be also configured in similar ways. Furthermore, though not shown, it will be understood that additional switches may be located in various other limbs of multifunctional filter 210. For example, an additional switch may be located on the limb connecting junction 306 to series element 320. This additional switch may be operated in conjunction with switch 315. Thus, when switch 315 is closed, the additional switch may be opened so as to isolate the input side of series element 320 and reduce signal loss in series element 320, or to present a higher impedance value in parallel with closed switch 315.

The person skilled in the art will appreciate that the systems, components, and methods described herein allow for using a multifunctional filter to minimize insertion loss in a multi-mode communications system. While the devices and methods have been described by means of specific embodiments and applications thereof, it is understood that numerous modifications and variations could be made thereto by those skilled in the art without departing from the spirit and scope of the disclosure. It is therefore to be understood that, within the scope of the claims, the disclosure may be practiced otherwise than as specifically described herein.

A number of embodiments of the present inventive concept have been described. Nevertheless, it will be understood that various modifications may be made without departing from the scope of the inventive teachings.

Accordingly, it is to be understood that the inventive concept is not to be limited by the specific illustrated embodiments, but only by the scope of the appended claims. The description may provide examples of similar features as are recited in the claims, but it should not be assumed that such similar features are identical to those in the claims unless such identity is essential to comprehend the scope of the claim. In some instances the intended distinction between claim features and description features is underscored by using slightly different terminology.

What is claimed is:

1. A circuital arrangement comprising a multifunctional filter, wherein:
    the circuital arrangement is configurable to operate in a first mode based on a first filtering function of the multifunctional filter for propagation of a first type of signal through the circuital arrangement,
    the circuital arrangement is configurable to operate in a second mode based on a second filtering function of the multifunctional filter for propagation of a second type of signal through the circuital arrangement, the second mode providing a lower insertion loss upon the second type of signal than the first mode, and
    configuration of the circuital arrangement to operate in one of the first mode and the second mode is respectively based on a configuration of the multifunctional filter to operate according to the first filtering function and the second filtering function,
    wherein the multifunctional filter comprises:
        a plurality of independently selectable serial filter components, a plurality of independently selectable shunt filter components, a plurality of parallel switches connected in parallel with the plurality of independently selectable serial filter components and a plurality of serial switches connected in serial with the plurality of independently selectable shunt filter components.

2. The circuital arrangement according to claim 1, wherein the first filtering function is a bandpass filter and the second filtering function is a lowpass filter.

3. The circuital arrangement according to claim 1, wherein the first filtering function is a bandpass filter and the second filtering function is a notch filter.

4. The circuital arrangement according to claim 1, wherein the first filtering function is a bandpass filter and the second filtering function is a bandpass filter.

5. The circuital arrangement according to claim 1, wherein the first filtering function is a bandpass filter and the second filtering function is a highpass filter.

6. The circuital arrangement according to claim 1, wherein the first filtering function is a lowpass filter and the second filtering function is a notch filter.

7. The circuital arrangement according to claim 6, wherein the circuital arrangement is a duplexer.

8. The circuital arrangement according to claim 1, wherein:
    during operation in the first mode, the multifunctional filter provides a first propagation path of the first type of signal by inclusion of the plurality of independently selectable serial and shunt filter components in the first propagation path, and during operation in the second mode, the multifunctional filter provides a second propagation path of the second type of signal by removal of at least one filter component of the plurality of independently selectable serial and shunt filter components from the second propagation path.

9. The circuital arrangement according to claim 8, wherein inclusion of the plurality of independently selectable serial and shunt filter components in the first propagation path comprises placing the plurality of parallel switches in an open position such that no serial switch is present in the first propagation path and placing the plurality of serial switches in a closed position.

10. The circuital arrangement according to claim 9, wherein the removal of at least one filter component of the plurality of independently selectable serial and shunt filter components from the second propagation path comprises placing one of a corresponding parallel switch of the plurality of parallel switches in a closed position, and a corresponding serial switch of the plurality of serial switches in an open position.

11. The circuital arrangement according to claim 1, wherein the first type of signal is a frequency division duplex signal and the second type signal is a time division duplex signal.

12. The circuital arrangement according to claim 11, wherein the multifunctional filter is configured to provide a notch-type attenuation upon at least one harmonic component of the time division duplex signal.

13. The circuital arrangement according to claim 1, wherein the multifunctional filter comprises at least one variable impedance device for configuring the multifunctional filter to operate according to the first functional filter or the second functional filter.

14. A communication system comprising a receiver unit coupled to the circuital arrangement of claim 1.

15. The communication system according to claim 14, wherein the duplexer provides a propagation path of a receive signal received at the duplexer to the receiver unit, the receive signal being one of the first type of signal and the second type of signal.

16. The communication system according to claim 15, wherein the configurable filter comprises a plurality of parallel switches and a plurality of serial switches, and wherein the propagation path of the second type of signal is provided by closing said plurality of parallel switches and opening said plurality of serial switches.

17. A multifunctional filter, comprising:
a first filtering function for propagation of a first type of signal through the multifunctional filter during a first mode of operation of the multifunctional filter,
a second filtering function for propagation of a second type of signal through the multifunctional filter during a second mode of operation of the multifunctional filter, the second filtering function providing a lower insertion loss upon the second type of signal than the first filtering function,
wherein the multifunctional filter comprises:
a plurality of independently selectable serial filter components, a plurality of independently selectable shunt filter components, a plurality of parallel switches connected in parallel with the plurality of independently selectable serial filter components and a plurality of serial switches connected in serial with the plurality of independently selectable shunt filter components.

* * * * *